United States Patent [19]

Hsieh et al.

[11] Patent Number: 5,258,640
[45] Date of Patent: Nov. 2, 1993

[54] GATE CONTROLLED SCHOTTKY BARRIER DIODE

[75] Inventors: Chang-Ming Hsieh; Louis L. Hsu, both of Fishkill; Phung T. Nguyen, Poughkeepsie; Lawrence F. Wagner, Jr., Fishkill, all of N.Y.

[73] Assignee: International Business Machines Corporation, Armonk, N.Y.

[21] Appl. No.: 939,214

[22] Filed: Sep. 2, 1992

[51] Int. Cl.⁵ .................... H01L 29/48; H01L 29/56
[52] U.S. Cl. .................... 257/471; 257/476; 257/486
[58] Field of Search ............... 257/471, 476, 486, 280, 257/291, 497

[56] References Cited

U.S. PATENT DOCUMENTS

| | | | |
|---|---|---|---|
| 4,149,174 | 4/1979 | Shannon | 257/497 |
| 4,801,983 | 1/1989 | Ueno et al. | 257/471 |
| 4,811,065 | 3/1989 | Cogan . | |
| 5,021,840 | 6/1991 | Morris | 257/476 |
| 5,081,509 | 1/1992 | Kozaka et al. | 257/471 |

FOREIGN PATENT DOCUMENTS

| | | | |
|---|---|---|---|
| 61-36979 | 2/1986 | Japan | 257/497 |
| 2-91975 | 3/1990 | Japan | 257/471 |

*Primary Examiner*—Rolf Hille
*Assistant Examiner*—Minhlcan Tran
*Attorney, Agent, or Firm*—Whitham & Marhoefer

[57] ABSTRACT

An integrated gate and semiconductor barrier layer diode which functions as a regular diode when the gate is turned off and as, a Schottky barrier diode with the gate turned on.

16 Claims, 5 Drawing Sheets

GATE CONTROLLED SCHOTTKY BARRIER DIODE

BACKGROUND OF THE INVENTION

1. Field of the Invention

The present invention generally relates to Schottky-barrier diodes (SBD) and, more specifically, to a gated semiconductor device that can be forward biased to exhibit the low forward voltage of a Schottky-barrier diode or reverse biased to exhibit the high breakdown voltage of a P-N junction.

2. Description of the Prior Art

A Schottky barrier diode is a rectifying metal-semiconductor junction formed by plating, evaporating, or sputtering a variety of metals on N- or P-type semiconductor materials. Schottky diodes are fabricated from N-on-N+ or P-on-P+ epitaxial material where the P and N layers are optimized in thickness and carrier concentration. Generally, N-type silicon and N-type GaAs are used.

Schottky diodes are fabricated by a planar technique. A $SiO_2$ layer is thermally grown or deposited on a semiconductor wafer, and windows are etched in the $SiO_2$ by photolithography and etching techniques. Metals to form a Schottky diode are deposited by evaporation, sputtering, chemical vapor deposition (CVD), or plating techniques.

A conventional SBD usually exhibits a characteristic where in its reverse bias state, a high leakage current exists with a low breakdown voltage as compared to a P-N diode, which provides a high reverse breakdown voltage. If a P-N diode alone is used, its forward voltage is higher than that of an SBD. For a given area and forward current level, SBDs have a smaller forward voltage drop than does a P-N diode.

The general state of the art relative to Schottky diode fabrication and use is described in U.S. Pat. Nos. 4,801,983 to Ueno et al. and 4,811,065 to Cogan. Ueno et al. describes an SBD hard wired in series with source or drain of a FET. The gate electrode of the FET is used as a switching control electrode, and a current flowing through the switching circuit in a direction from the input terminal to the output terminal is controlled in accordance with a signal applied to the switching control electrode, but no provision is provided for electrically controlling the characteristics of the SBD as is so done in the instant invention.

The Cogan patent shows an SBD being hard wired in parallel to an N channel DMOS in order to prevent the body diode from turning on when forward voltages are applied. Of course, the SBD, being hard wired, is always electrically connected in the circuit, whereas in the present invention the gated SBD has two alternate current paths depending on the terminal bias voltages, allowing the SBD current to prevail when it is forward biased but suppressed when it is reversed biased.

SUMMARY OF THE INVENTION

It is thereforean object of the present invention to provide an integrated semiconductor device which will exhibit a low forward voltage SBD or a low reverse biased leakage current P-N diode characteristic.

According to the invention, there is provided an integrated gate and semiconductor barrier layer device which functions as a regular diode with the gate turned off, but as an SBD with the gate turned on.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
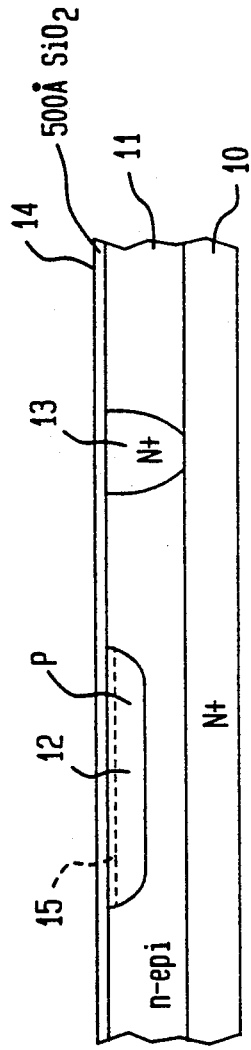
FIG. 1 to 5 show the structure of the invention during various stages of the fabrication process.
Figure 2:
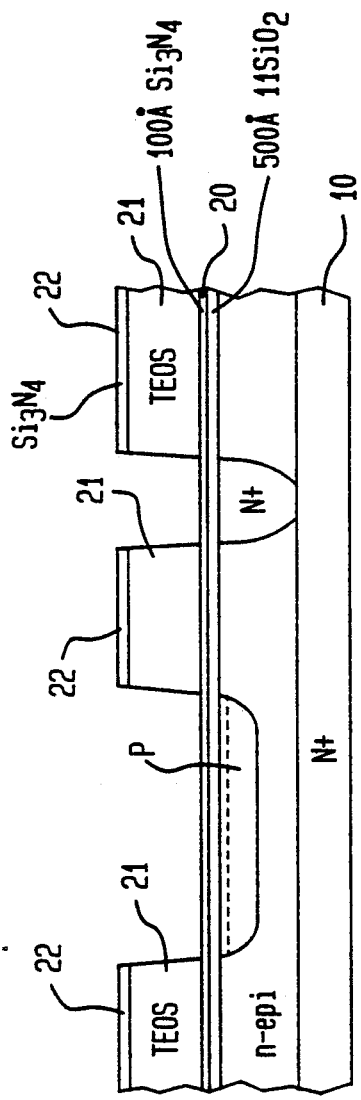

Referring now to the drawings, and more particularly to FIG. 1, as is typical in the fabrication of Schottky diodes, the most desirable method uses a diffused planar junction on a epitaxial substrate, where one begins from an N-on-N+ epitaxial material. In this case, the substrate or a subcollector 10 is a heavily doped low resistivity $N^{30}$ layer of silicon (Si) upon which a lightly doped, high resistivity layer of N-epi silicon is epitaxially grown. A cathode 13 extends through the N-epi layer and is provided by diffusing an N-type dopant (phosphorus) through a cathode window in the N-epi layer 11. While cathode 13 has been shown extending through the N-epi layer, it can likewise comprise a metal contact directly connected to the bottom surface of the N+ substrate. The anode 12 is formed by implanting a P-type dopant (boron) through an anode window, then an N-type doping material (arsenic) is implanted through the same window such that the surface of silicon 15 is turned into an N-type channel to a depth of about 500Å. Next, a thin oxide layer 14 of $SiO_2$ of about 500Å is grown as a gate oxide. Thus, as shown in FIG. 2, a thin layer of nitride is deposited on the gate oxide to provide a layer 20 of $Si_3N_4$ of about 100Å, followed by the chemical vapor deposition of a TEOS (Tetra-Ethyl-Ortho-Silicate) layer 21 of about 3000Å, followed by another nitride layer 22 of $Si_3N_4$ of about 1000Å, at this stage, anode and cathode holes are opened through the $Si_3N_4$ layer 22 and TEOS layer 21 in the areas immediately atop the anode and cathode windows 12 and 13.

Figure 3:
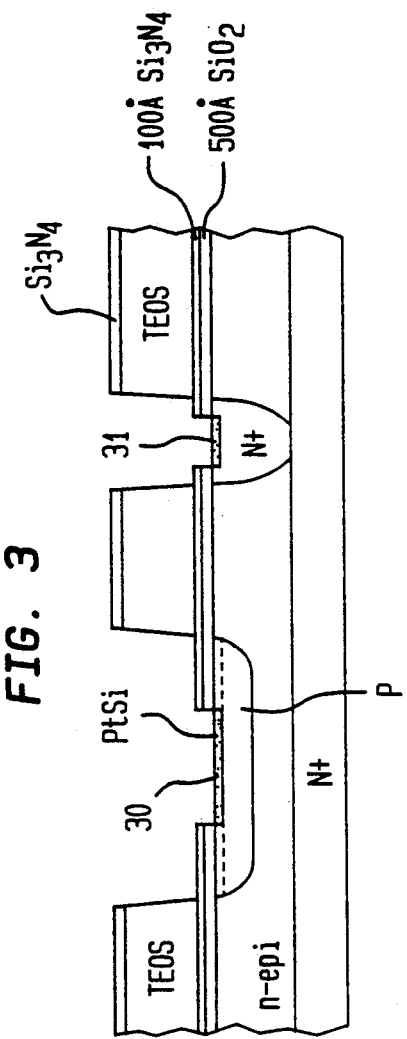

Now referring to FIG. 3, the next step consists of the etching of photolithography pattern window 30, actually slightly overetching, by reactive ion etching (RIE) a portion of each contact hole through the $Si_3N_4$ layer 20 and $SiO_2$ layer 14 to expose the underlying silicon layer 12 in the anode window and 13 in the cathode window forming anode and cathode contact windows, respectively. It is necessary to etch completely through the N doped channel layer 15 of anode window 12 to the implanted P layer.

Figure 4:
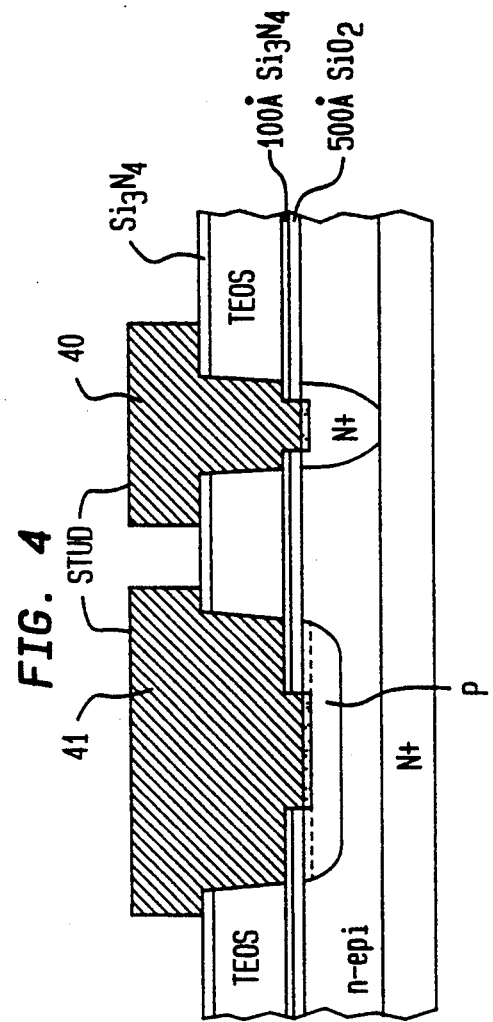

Again referring to FIG. 3, it is necessary to form a layer of conductive material in respective anode and cathode contact windows. Preferably, the conductive material for the anode contact window comprises a metal contact silicide layer, and in this instance, we use Pt to form PtSi layers 30 and 31, to a thickness of about 100Å. Looking now at FIG. 4, a stud metal is used to completely fill the open anode and cathode windows to provide electrical contacts 40 and 41 for the structure.

Figure 5:
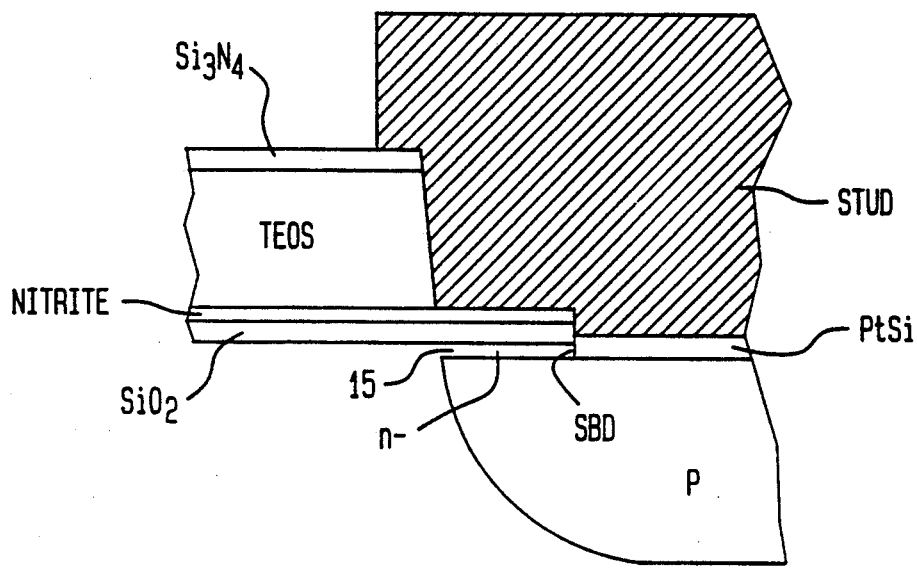
Figure 6:
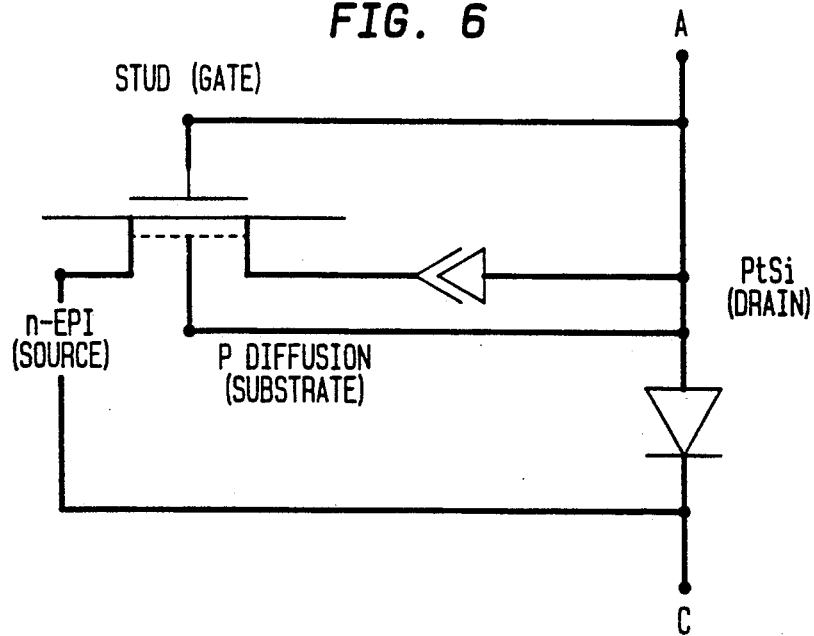
FIG. 6 shows a schematic circuit diagram of the embodiment shown in FIG. 5.
Figure 7A:
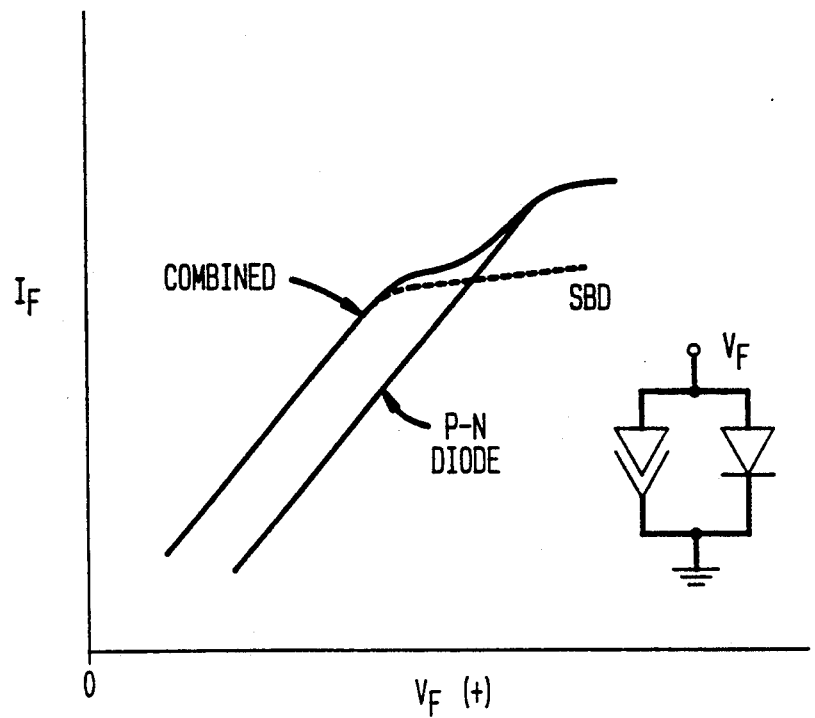
FIGS. 7A and 7B show I-V characteristic curves for the operation of the device under forward and reverse conditions, respectively.

Since the silicon surface under the thin gate 15 (FIG. 1) is N-type, there is a depletion mode FET formed. In addition, the inversion channel 15 is in contact with PtSi where it forms an SBD at the drain side as shown in FIG. 5. The barrier height of PtSi to N-type silicon is high (about 0.85eV). The SBD is formed laterally and is around the perimeter of anode contact window 30. The barrier height of PtSi to P-type silicon is low (about 0.25eV), thereby an ohmic contact to P layer 12 is formed. The equivalent FET model is shown in FIG. 6. Therefore, at forward bias, the P-N diode is in parallel with this SBD and dominated by SBD, as shown by FIG. 7A. At reverse bias, the gate is at negative voltage, and when it is beyond the threshold voltage, the N channel as well as SBD will disappear. The reverse breakdown voltage will be the same as P-N diode alone, as shown by FIG. 7B.

Looking more closely at FIG. 7A, we see that with a positive voltage applied to contact 41, the gate 14 of FIG. 5 is turned on, the N-type channel forms a conductive path 15 to provide the I-V characteristics for the combination of a SBD and P-N diode.

Figure 7B:
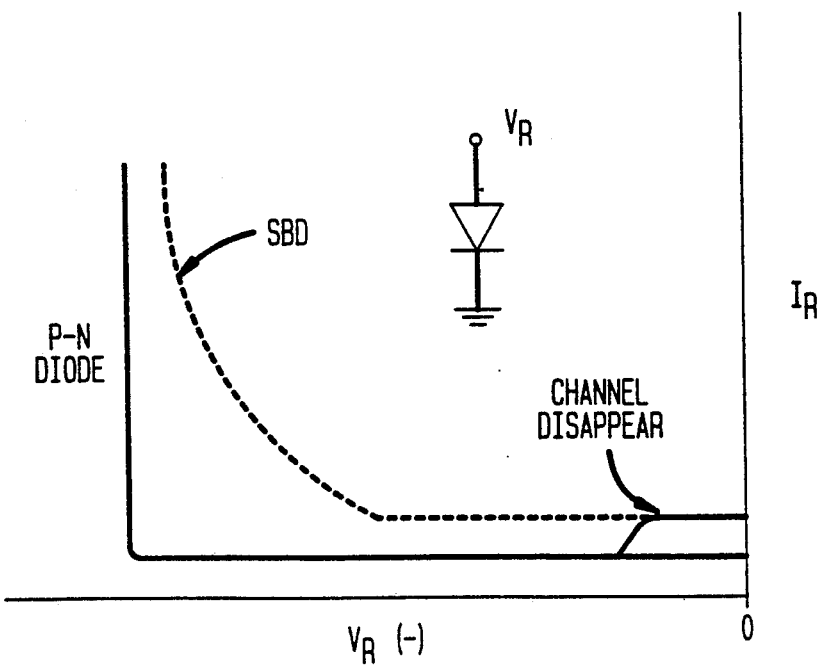

FIG. 7B shows the I-V characteristics for the circuit with the gate turned off. Note that the SBD characteristic disappears leaving only the P-N junction diode under these conditions.

Figure 8:
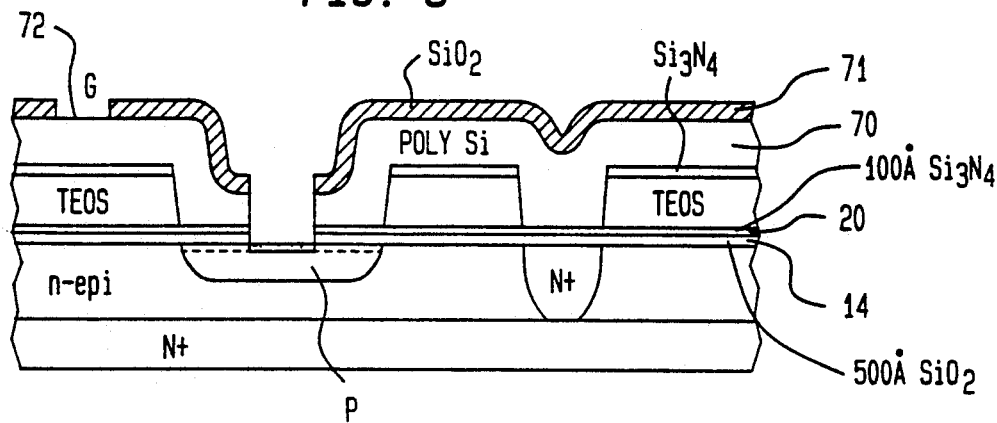
FIGS. 8 and 9 show steps in fabricating another embodiment of the invention, with the anode and gate disconnected and biased independently.
Figure 9:
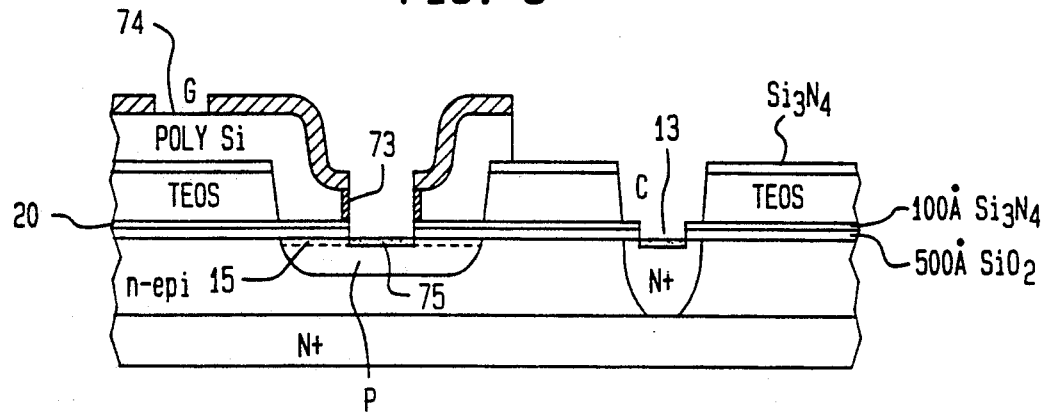

A second embodiment of the invention is shown in FIG. 9 wherein the anode and gate electrodes are disconnected and biased independently in order to provide the flexibility of selecting the inversion channel and parallel SBD separately or not at all. The structure of FIG. 9 is obtained by fabricating the structure to the stage shown in FIG. 2, with the exception of not opening the hole at the cathode window 13. Beginning at this step, then, a layer of polysilicon (poly Si) 70 is deposited over the entire top surface of the structure and a layer of oxide ($SiO_2$) 71 is grown thereon. Again, as shown in FIG. 8, a hole or gate contact window 72 for the gate is opened through the oxide layer, as well as an anode contact window at the center of the implanted anode. The hole or anode contact window above the anode region 12 is produced by reactive ion etching through the oxide layer 71, the poly Si layer 70, the nitride layer 20, the gate oxide layer 14, through the N-doped layer 15 of the implanted anode, thereby preparing the anode for metallization. The structure of FIG. 8 is now further deposited with a thin layer of oxide ($SiO_2$) 73 of about 300Å and then directionally etched by RIE, the sidewall of the poly Si within the anode window is thereby formed. The electrical modulation can be made by using a gate electrode with a contact at 72. Now, with the photoresist pattern, the cathode window 13 is opened by removing the oxide layer 71, poly Si layer 70, nitride layer 20, and gate oxide layer 14. The anode electrode at 15, gate contact at 72 and cathode electrode at 13 are thereby metalized with PtSi, as shown at 74, 75 and 76.

Figure 10:
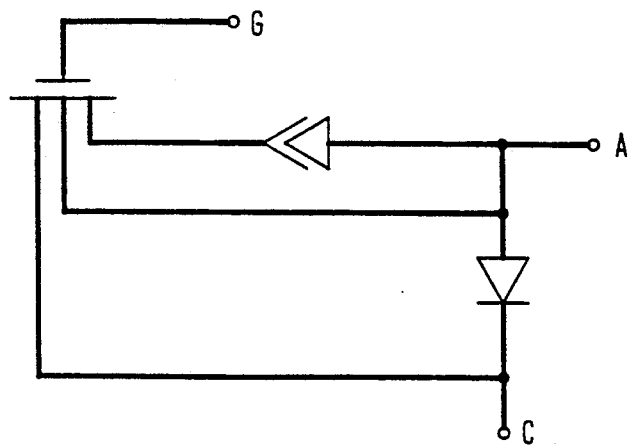
FIG. 10 shows a schematic diagram of the equivalent circuit of FIG. 9.

The structure now fabricated and shown in FIG. 9 will function in accordance with the schematic diagram shown in FIG. 10, whereby the gate at 72 and the anode electrode at 75 are separated. Hence, the gate electrode can be biased such that a decision can be made as to whether the inversion channel and parallel SBD are desired to exist or not.

While the invention has been described in terms of two preferred embodiments, those skilled in the art will recognize that the invention can be practiced with modification within the spirit and scope of the appended claims.

Having thus described our invention, what we claim as new and desire to secure by Letters Patent is as follows:

1. A semiconductor device which functions as a Schottky barrier diode (SBD) when the device is forward biased and as a regular P-N junction diode when the device is reverse biased, comprising:
   a substrate of heavily doped low-resistivity N+ Si upon which is epitaxially grown a layer of lightly doped N-epi Si;
   a cathode contacted with the N+ substrate;
   a P-type dopant material implanted in an anode region of said N-epi layer to provide an anode;
   an N-type doping material implanted on the surface of the P-type implanted anode region, the N-type material forming an N-type channel layer;
   a thin gate dielectric layer formed over the entire surface of the N-epi layer, the thin gate dielectric layer and the N-type channel layer having an anode contact window formed therein above the anode region;
   a thick dielectric layer formed over the top surface of the thin gate dielectric layer, the thick dielectric layer having an anode region window formed therein above the anode region, the anode region window being larger than the anode contact window;
   a layer of conductive material deposited on an anode contact region defined by the anode contact window, the conductive material forming a Schottky barrier diode with the N-type channel layer and an ohmic contact to the anode; and
   electrode metal filling the anode region window for providing an electrical connector thereto,
   whereby a positive forward bias voltage applied to the anode gates the device "on" to provide a Schottky barrier diode at the interface of the conductive material layer and the N-type channel layer sandwiched between a portion of the P-type implanted material and the gate dielectric layer, and whereby a negative reverse bias voltage applied to the anode gates the device "off" to provide a P-N junction characteristic of a regular semiconductor diode.

2. The semiconductor device recited in claim 1, wherein said N-type channel layer is of a thickness of about 500Å.

3. The semiconductor device recited in claim 1 further wherein said thin gate dielectric layer comprises a thin oxide layer having a thickness of about 500Å and further having a nitride layer of a thickness of about 100Å deposited thereon.

4. The semiconductor device recited in claim 1 further wherein said thick dielectric layer comprises a thick layer of chemical vapor deposited TEOS (Tetra-Ethyl-Ortho-Silicate) layer of a thickness of about 3000Å and further having a nitride layer of a thickness of about 1000Å deposited thereon.

5. The semiconductor device recited in claim 1, wherein said layer of conductive material comprises silicide.

6. The semiconductor device recited in claim 1, wherein said layer of conductive material comprises metal.

7. The semiconductor device recited in claim 1, further wherein said cathode comprises N+ material implanted or diffused completely through a cathode region of said N-epi layer, the diffused N+ material making intimate contact with the N+ substrate.

8. A semiconductor device having a gate and which functions as a Schottky barrier diode (SBD) when the gate is forward biased and as a regular P-N junction diode when the gate is reverse biased, said device comprising:
- a substrate of heavily doped low-resistivity N+ Si upon which is epitaxially grown a layer of lightly doped N-epi Si;
- a cathode contacted with the N+ substrate;
- a P-type dopant material implanted in an anode region of said N-epi layer to provide an anode;
- an N-type doping material implanted on the surface of the P-type implanted anode region, the N-type material forming an N-type channel layer;
- a thin gate dielectric layer formed over the entire surface of the N-epi layer, the thin gate dielectric layer and the N-type channel layer having an anode contact window formed therein above the anode region;
- a thick dielectric layer formed over the top surface of the thin gate dielectric layer, the thick dielectric layer having an anode region window formed therein above the anode region, the anode region window being larger than the anode contact window;
- a polysilicon layer formed over the entire top surface of the device and having a corresponding anode contact window formed therein;
- a dielectric layer formed on said polysilicon layer for completely covering the exposed surface of the polysilicon layer, the dielectric layer further having a gate contact window formed therein and located away from the anode contact window;
- a first layer of conductive material deposited on said polysilicon layer through the gate contact window to provide a gate contact;
- a second layer of conductive material deposited on an anode contact region defined by the anode contact window, the conductive material forming a Schottky barrier diode with the N-type channel layer and an ohmic contact to the anode; and
- electrode metal filling the anode region window for providing an electrical connector to the anode,
- whereby a positive forward bias voltage applied to the gate switches the device "on" to provide a Schottky barrier diode at the interface of the second conductive material layer and the N-type channel layer sandwiched between a portion of the P-type implanted material and the gate dielectric layer, and whereby a negative reverse bias voltage applied to the gate switches the device "off" to provide a P-N junction characteristic of a regular semiconductor diode.

9. The semiconductor device recited in claim 8, wherein said N-type channel layer is of a thickness of about 500Å.

10. The semiconductor device recited in claim 8 further wherein said thin gate dielectric layer comprises a thin oxide layer having a thickness of about 500Å and further having a nitride layer of a thickness of about 100Å deposited thereon.

11. The semiconductor device recited in claim 8 further wherein said thick dielectric layer comprises a thick layer of chemical vapor deposited TEOS (Tetra-Ethyl-Ortho-Silicate) layer of a thickness of about 3000Å and further having a nitride layer of a thickness of about 1000Å deposited thereon.

12. The semiconductor device recited in claim 8, wherein said second layer of conductive material comprises silicide.

13. The semiconductor device recited in claim 8, wherein said second layer of conductive material comprises metal.

14. The semiconductor device recited in claim 8, further wherein said cathode comprises N+ material implanted or diffused completely through a cathode region of said N-epi layer, the diffused N+ material making intimate contact with the N+ substrate.

15. A gated diode structure, comprising:
- a subcollector of N+ material;
- an N-type epitaxial layer on a top surface of said N+ material;
- an N-type doping material implanted or diffused through a cathode window to form are N-type cathode extending through said N epitaxial layer to said N+ subcollector;
- a P-type doping material implanted into said N-type epitaxial layer through an anode window to form a P-type anode;
- an N-type doping material implanted in said P-type anode to form a channel;
- a thin gate dielectric layer on top of said N-type epitaxial layer, the thin gate dielectric having a cathode window therein, and further the thin gate dielectric layer and the N-type channel having an anode contact window formed therein;
- a thick dielectric layer formed over the top surface of the thin gate dielectric layer, the thick dielectric layer having corresponding anode and cathode windows formed therein, the anode window of said thick dielectric layer further being larger than the anode contact window;
- a silicide layer deposited on a cathode contact region defined by the cathode window, said silicide layer further being deposited on an anode contact region defined by the anode contact window, the silicide on the anode forming a Schottky barrier diode with the channel and an ohmic contact to the anode; and
- metal contacts provided to take contact with said silicide layer within said cathode window and said anode contact window, the contact in the anode window together with the thin dielectric layer forming a gate for switching the N-type channel, whereby a forward bias produces Schottky-barrier diode characteristic and a reverse bias produces a P-N junction diode characteristic.

16. A gated diode structure, comprising:
- a subcollector of N+ material;
- an N-type epitaxial layer on a top surface of said N+ material;
- an N-type doping material implanted or diffused through a cathode window to form an N-type cathode extending through said N epitaxial layer to said N+ subcollector;
- a P-type doping material implanted into said N-type epitaxial layer through an anode window to form a P-type anode;
- an N-type doping material implanted in said P-type anode to form a channel;

a thin gate dielectric layer on top of said N-type epitaxial layer, the thin gate dielectric having a cathode window therein, and further the thin gate dielectric layer and the N-type channel having an anode contact window formed therein;

a thick dielectric layer formed over the top surface of the thin gate dielectric layer, the thick dielectric layer having corresponding anode and cathode windows formed therein, the anode window of said thick dielectric layer further larger than the anode contact window;

a polysilicon layer formed over the entire top surface of the structure and having corresponding anode and cathode windows formed therein;

a dielectric layer formed on said polysilicon layer for completely covering the exposed surface of the polysilicon layer, the dielectric layer further having a gate contact window formed therein and located away from the anode contact window;

a silicide layer deposited on contact regions defined by the cathode window, the anode contact window, and the gate contact window, respectively, said silicide layer on the anode forming a Schottky barrier diode with the channel and an ohmic contact to the anode; and metal contacts provided to take contact with said silicide layer within the cathode, anode contact, and gate contact windows, whereby a positive forward bias voltage applied to the gate switches the device "on" to provide a Schottky barrier diode characteristic and a negative reverse bias voltage applied to the gate switches the device "off" to provide a P-N junction diode chararteristic.

* * * * *